United States Patent
Lo et al.

(10) Patent No.: US 10,095,258 B1
(45) Date of Patent: Oct. 9, 2018

(54) OPERATION MODE DETERMINATION CIRCUIT AND METHOD THEREOF

(71) Applicant: RICHTEK TECHNOLOGY CORPORATION, Zhubei, HsinChu (TW)

(72) Inventors: Chieh-Min Lo, Miaoli (TW); Yi-Syue Jhu, New Taipei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/680,011

(22) Filed: Aug. 17, 2017

(30) Foreign Application Priority Data

Mar. 17, 2017 (CN) .......................... 2017 1 0159975

(51) Int. Cl.
 *H03K 3/00* (2006.01)
 *G05F 3/02* (2006.01)
 *G01R 17/02* (2006.01)
(52) U.S. Cl.
 CPC ............... *G05F 3/02* (2013.01); *G01R 17/02* (2013.01)

(58) Field of Classification Search
 CPC ........................................................ G05F 3/02
 See application file for complete search history.

(56) References Cited

U.S. PATENT DOCUMENTS 4,984,250 A * 1/1991 Koyama .................. H04B 3/02
 178/69 R

* cited by examiner

*Primary Examiner* — Daniel Puentes
(74) *Attorney, Agent, or Firm* — Tung & Associates

(57) ABSTRACT

An operation mode determination circuit for sensing a setting resistance between a setting node and a reference voltage or a ground to determine an operation mode, comprises: a pull-up power circuit, for generating a pull-up power onto the setting node, and a floating detection circuit. The pull-up power circuit adjusts the pull-up power at a first power level, and triggers an low power detach detection procedure after a predetermined first time period, wherein the pull-up power is adjusted at a second power level which is less than the first power level to an extent that an electrolysis effect is negligible when an electrolytic substance exists and is coupled to the setting node. The floating detection circuit triggers the operation mode detection procedure when the voltage on the setting node is higher than a first voltage threshold in the low power detach detection procedure.

18 Claims, 3 Drawing Sheets

US 10,095,258 B1

OPERATION MODE DETERMINATION CIRCUIT AND METHOD THEREOF

CROSS REFERENCE

The present invention claims priority to CN 201710159975.2, filed on Mar. 17, 2017.

BACKGROUND OF THE INVENTION

Field of Invention

The present invention relates to an operation mode determination circuit, in particular an operation mode determination circuit which can prevent contact pins from rusting. The present invention also relates to an operation mode determination method for preventing contact pins from rusting.

Description of Related Art

FIG. 1 shows a prior art operation mode determination circuit (operation mode determination circuit 1) which for example can be used for determining an operation mode of a system circuit by sensing a resistance of a mode operation resistor RS between a setting node (for example but not limited to USB-Universal Serial Bus-ID pin) and ground. The operation mode for example may be one of a normal operation mode, an OTG (On-The-Go) mode (wherein RS should be 0 according to USB specification), a detach mode, a testing operation mode, or other operation modes. The operation mode determination circuit 1 includes a pull-up power circuit 19 and a voltage sensing circuit 20, wherein the pull-up power circuit 19 includes a pull-up voltage source VPU and a pull-up resistor RPU or a pull-up current source IPU, which provides a pull-up power on the USB ID pin, whereby the voltage sensing circuit 20 can determine the operation mode according to the voltage on the USB ID pin.

However, the prior art shown in FIG. 1 has a problem that: when the USD ID pin contacts an electrolytic substance 80 (for example but not limited to liquid such as water), either intentionally (such as taking a photos in the water or using a device when swimming) or unintentionally (such as inadvertently soaking in water, getting wet in the rain, or being splashed by drinks), the USB ID pin may expedite its rusting due to electrolysis effect.

Compared to the prior art shown in FIG. 1, the present invention has an advantage that when not determining operation modes, the operation mode determination circuit can operate with a relatively low sensing current or voltage and can discharge the setting node, and hence the rusting process can be effectively slowed down so as to lengthen the product lifespan.

SUMMARY OF THE INVENTION

From one perspective, the present invention generates an operation mode determination circuit, configured to operably sense a setting resistance between a setting node and a reference voltage or a ground to determine an operation mode, comprising: a pull-up power circuit, configured to operably generate a pull-up power onto the setting node, and adjust the pull-up power to be at a first power level in an operation mode detection procedure, wherein the pull-up power circuit triggers a low power detach detection procedure after a first predetermined time period from when the operation mode detection procedure starts, and adjusts the pull-up power to be at a second power level in the low power detach detection procedure, wherein the second power level is less than the first power level to an extent that when an electrolytic substance exists and is coupled to the setting node, an electrolysis effect of the electrolytic substance is negligible; a voltage sensing circuit, configured to operably sense a voltage level of the setting node to determine an operation mode in the operation mode detection procedure; and a floating detection circuit which includes a comparison circuit for comparing the voltage level of the setting node to a first voltage threshold in the low power detach detection procedure, the floating detection circuit being configured to operably trigger the operation mode detection procedure when the voltage level of the setting node is higher than the first voltage threshold.

In one embodiment, the operation mode determination circuit further includes a pull-down circuit which is configured to operably execute a pull-down operation in the low power detach detection procedure to pull down the voltage level of the setting node to the reference voltage or the ground.

In one embodiment, the pull-down circuit pulls down the voltage level of the setting node to the reference voltage or the ground for a second predetermined time period and then stops the pull-down operation.

In one embodiment, the second predetermined time period is longer than the first predetermined time period to an extent that when the electrolytic substance exists and is coupled to the setting node, after a steady state time point, the voltage level of the setting node is not higher than the first voltage threshold, so that the electrolysis effect of the electrolytic substance is negligible.

In one embodiment, in the operation mode detection procedure, a detach mode is determined by the voltage sensing circuit when the voltage level of the setting node is higher than a second voltage threshold, wherein after the detach mode is determined and in the low power detach detection procedure, the floating detection circuit senses the voltage level of the setting node, and when the voltage level of the setting node is lower than a third voltage threshold, the floating detection circuit triggers to enter the operation mode detection procedure.

In one embodiment, the third voltage threshold is lower than the first voltage threshold.

In one embodiment, the pull-up power circuit includes a pre-regulator circuit configured to operably generate a pre-regulated voltage, and a pull-up resistor or a pull-up current source, wherein the pull-up resistor or the pull-up current source is electrically coupled between the pre-regulated voltage and the setting node, wherein in the operation mode detection procedure, the pre-regulator circuit adjusts the pre-regulated voltage to be at the first voltage level, and/or adjusts the pull-up resistor to have a first resistance, and/or adjusts the pull-up current source to be at a first current level such that the pull-up power is at the first power level, and in the low power detach detection procedure, the pre-regulator circuit adjusts the pre-regulated voltage to be at a second voltage level, and/or adjusts the pull-up resistor to have a second resistance, and/or adjusts the pull-up current source to be at a second current level such that the pull-up power is at the second power level.

In one embodiment, the pull-down circuit includes a pull-down resistor or a pull-down current source electrically coupled between the setting node and the reference voltage or the ground, wherein in the pull-down operation, the voltage level of the setting node is pulled down to the reference voltage or the ground correspondingly by the pull-down resistor or the pull down current source.

In one embodiment, the setting node is a USB (Universal Serial Bus) compliant ID pin, and the operation mode is the USB OTG (On-The-Go) mode.

In one embodiment, the electrolytic substance is water.

From another perspective, the present invention provides a method of determining an operation mode according to a setting resistance between a setting node and a reference voltage or a ground to determine an operation mode, comprising: generating a pull-up power onto the setting node; in an operation mode detection procedure, sensing a voltage level of the setting node to determine the operation mode; and in an low power detach detection procedure, comparing the voltage level of the setting node to a first voltage threshold, and triggering the operation mode detection procedure when the voltage level of the setting node is higher than the first voltage threshold; wherein the step of generating the pull-up power includes: in the operation mode detection procedure, adjusting the pull-up power to be at a first power level, and after a first predetermined time period from when the operation mode detection procedure starts, triggering the low power detach detection procedure; and in the low power detach detection procedure, adjusting the pull-up power to be at a second power level, wherein the second power level is less than the first power level to an extent that when an electrolytic substance exists and is coupled to the setting node, an electrolysis effect of the electrolytic substance is negligible.

In one embodiment, the method further includes: executing a pull-down operation in the low power detach detection procedure to pull down the voltage level of the setting node to the reference voltage or the ground.

In one embodiment, the method further includes: stopping the pull-down operation after pulling down the voltage level of the setting node to the reference voltage or the ground for a second predetermined time period.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
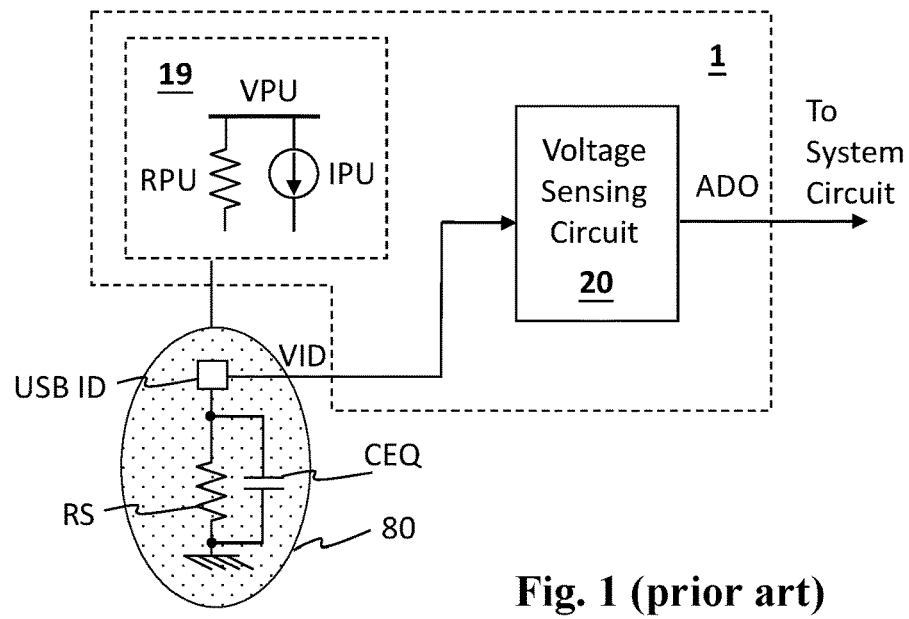
FIG. 1 shows a schematic diagram of a prior art operation mode determination circuit.
Figure 2:
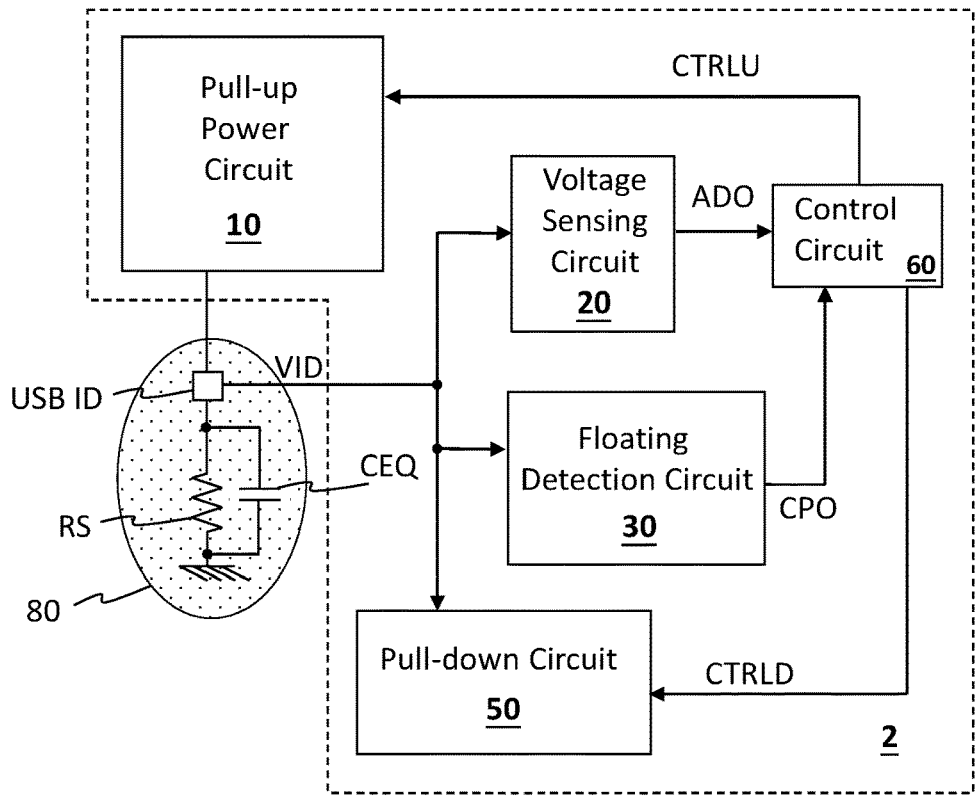
FIG. 2 shows a schematic diagram of one embodiment of the operation mode determination circuit according to the present invention.

FIG. 2 shows a schematic diagram of one embodiment of the operation mode determination circuit according to the present invention (operation mode determination circuit 2). As shown in the figure, the operation mode determination circuit 2 comprises a pull-up power circuit 10, a voltage sensing circuit 20, and a floating detection circuit 30. The pull-up power circuit 10 is configured to operably generate a pull-up power onto a setting node (for example but not limited to the USB ID pin), and adjust the pull-up power to be at a first power level in an operation mode detection procedure, so that when the USB ID pin is open circuit or coupled to a mode operation resistor RS with different resistances, the voltage sensing circuit 20 can sense the USB ID pin voltage VID to determine various operation modes. The pull-up power can be adjusted by for example but not limited to adjusting the voltage source, the current source, or the output impedance of the pull-up power circuit 10. After a first predetermined time period TP1 from when the operation mode detection procedure starts, the pull-up power circuit 10 triggers an low power detach detection procedure and adjusts the pull-up power to be at a second power level in the low power detach detection procedure, wherein the second power level is less than the first power level to an extent that when an electrolytic substance 80 (for example water) exists and is coupled to the USB ID pin, the electrolysis effect of the electrolytic substance is negligible.

Still referring to FIG. 2, the floating detection circuit 30 is configured to operably compare the USB ID pin voltage VID to a first voltage threshold VTH1 in the low power detach detection procedure, and trigger the aforementioned operation mode detection procedure when the USB ID pin voltage VID is higher than the first voltage threshold VTH1 (corresponding to the resistance of the mode operation resistor RS being higher than a predetermined resistance threshold RTH1).

Still referring to FIG. 2, in one embodiment, the operation mode determination circuit 2 further includes a pull-down circuit 50 which is configured to operably execute a pull-down operation in the low power detach detection procedure to pull down USB ID pin voltage VID to a ground voltage. Note that in one embodiment, the USB ID pin voltage VID may be pulled down to any other reference voltage by the pull-down operation. In one embodiment, the pull-down operation stops after lasting for a second predetermined time period. At this time point, if no electrolytic substance exists, the USB ID pin voltage VID will rise due to the aforementioned pull-up power to exceed the first voltage threshold VTH1, whereby the aforementioned operation mode detection procedure will be triggered again. On the other hand, in one embodiment, if the electrolytic substance 80 exists and is coupled to the USB ID pin, the USB ID pin voltage VID will achieve a steady state voltage after several repeated transitions between the aforementioned operation mode detection procedure and the low power detach detection procedure. In one embodiment, the steady state voltage will not be higher than the first voltage threshold VTH1, whereby the pull-up power circuit 10 can maintain the pull-up power to be at the second power level on the USB ID pin. And as mentioned earlier, since the second power level is less than the first power level to an extent that the electrolysis effect is negligible. In one preferred embodiment, the aforementioned second predetermined time period TP2 is sufficiently longer than the first predetermined time period TP1 such that the steady state voltage keeps not higher than the first voltage threshold VTH1.

In one embodiment, the operation mode determination circuit 2 may include a control circuit 60, configured to operably generate control signals CTRLU and CTRLD according to a converted output signal ADO generated by the voltage sensing circuit 20 by sensing the USB ID pin voltage VID, and/or according to a comparison output CPO generated by the floating detection circuit 30. The control signals CTRLU and CTRLD controls the pull-up power circuit 10 and the pull-down circuit 50 respectively to achieve the aforementioned operations or procedures according to the present invention.

Figure 3:
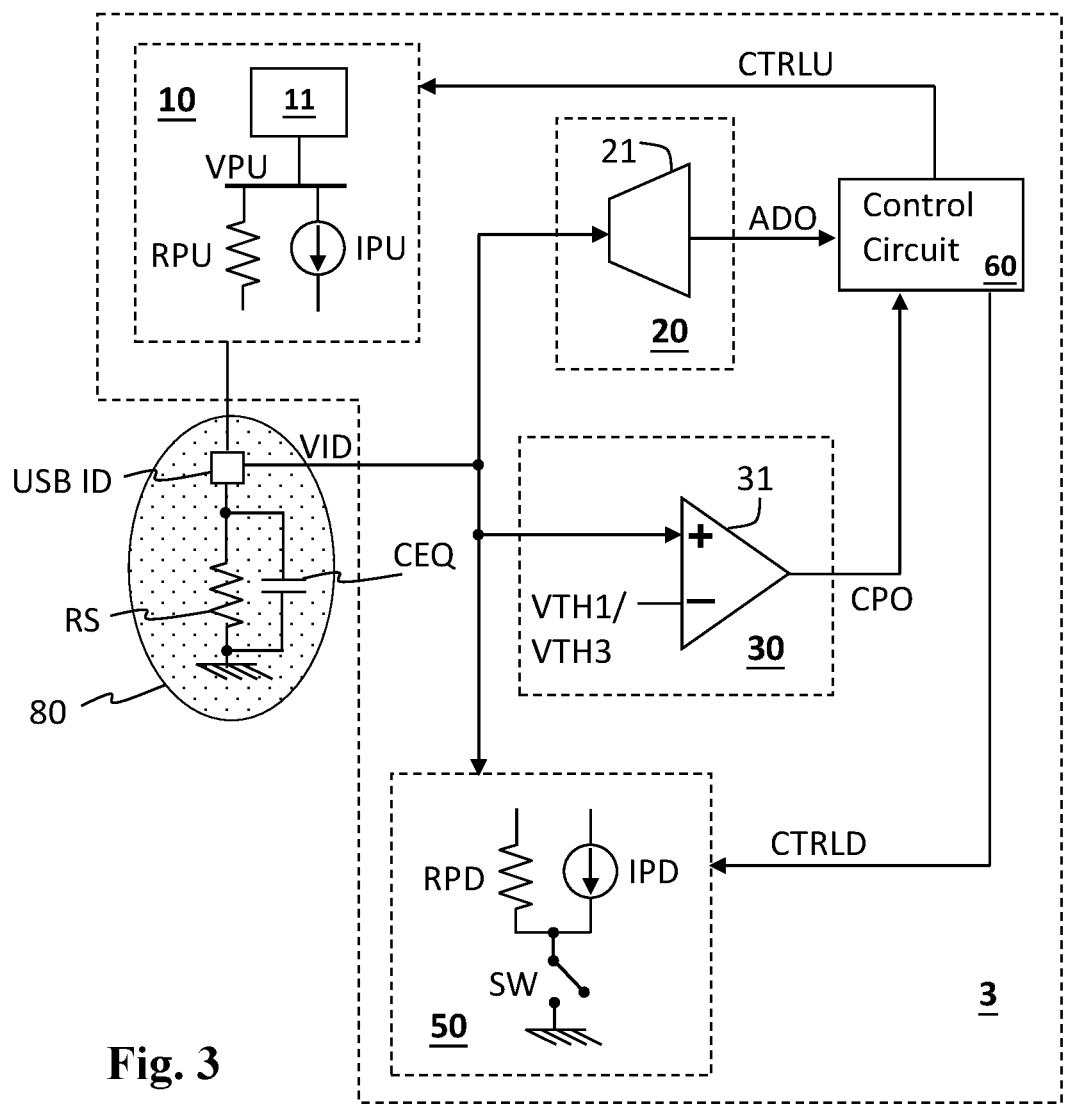
FIG. 3 shows a schematic diagram of one specific embodiment of the operation mode determination circuit according to the present invention.

FIG. 3 shows a schematic diagram of one specific embodiment of the operation mode determination circuit according to the present invention (operation mode determination circuit 3). As shown in the figure, in one embodiment, the pull-up power circuit 10 includes a pre-regulator circuit 11 configured to operably generate a fixed or adjustable pre-regulated voltage VPU, and a pull-up resistor RPU or a fixed or adjustable pull-up current source IPU, wherein the pull-up resistor RPU or the pull-up current source IPU is electrically coupled between the pre-regulated voltage VPU and the USB ID pin. In the operation mode detection procedure, the pre-regulator circuit 11 does one or more of the followings: (1) adjusts the pre-regulated voltage VPU to be at the first voltage level, and/or (2) adjusts the pull-up resistor RPU to be with a first resistance, and/or (3) adjusts the pull-up current source IPU to be at a first current level, such that the pull-up power is at the first power level. In the low power detach detection procedure, the pre-regulator circuit 11 does one or more of the followings: (1) adjusts pre-regulated voltage VPU to be at a second voltage level, and/or (2) adjusts the pull-up resistor RPU to be with a second resistance, and/or (3) adjusts the pull-up current source IPU to be at a second current level, such that the pull-up power is at the second power level.

Note that in one preferred embodiment, (1) the second voltage level is lower than the first voltage level, and/or (2) the second resistance is higher than the first resistance, and/or (3) the second current level is lower than the first current level, such that the aforementioned second power level is less than the first power level to an extent that when the electrolytic substance 80 (for example water) exists and is coupled to the USB ID pin, the electrolytic process is negligible.

Still referring to FIG. 3, in one embodiment, the pull-down circuit 50 includes a pull-down resistor RPD or a pull-down current source IPD electrically coupled between the ground voltage and the USB ID pin, wherein in the pull-down operation, the USB ID pin voltage VID is pulled down to the ground voltage by the pull-down resistor RPD or the pull down current source IPD. In one embodiment, the pull-down circuit 50 may include a switch SW to control the pull-down resistor RPD or the pull down current source IPD to execute or stop the aforementioned pull-down operation according to the aforementioned procedures and time periods.

Still referring to FIG. 3, the floating detection circuit 30 includes a comparison circuit 31 for generating the comparison output CPO by comparing the USB ID pin voltage VID to the first voltage threshold VTH1 in the low power detach detection procedure. When the USB ID pin voltage VID is higher than the first voltage threshold VTH1, the control circuit can trigger the operation mode detection procedure according to the comparison output CPO.

Still referring to FIG. 3, since the voltage sensing circuit 20 can determine various operation modes, in one embodiment, the voltage sensing circuit 20 may include an analog to digital conversion circuit 21 to determine the voltage with a higher accuracy, wherein the analog to digital conversion circuit 21 generates the converted output signal ADO according to the USB ID pin voltage VID. The control circuit then determines the aforementioned operation modes according to the converted output signal ADO. In one embodiment, in the operation mode detection procedure, a detach mode is determined by the voltage sensing circuit 20 when the USB ID pin voltage VID is higher than a second voltage threshold VTH2. After the detach mode is determined and in the low power detach detection procedure, the floating detection circuit 30 senses the USB ID pin voltage VID, and when the USB ID pin voltage VID is lower than a third voltage threshold VTH3, the floating detection circuit 30 triggers to enter the operation mode detection procedure.

Figure 4:
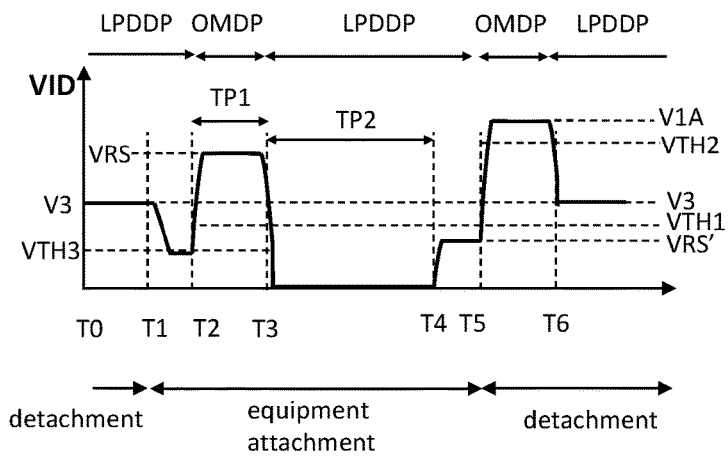
FIG. 4 shows a schematic waveform corresponding to FIGS. 2 and 3 for illustrating equipment attachment and detachment.

Please refer to FIG. 4 which shows schematic waveforms corresponding to embodiments shown in FIG. 2 or 3 for illustrating equipment attachment and detachment. As shown in the figure, at time point T0-T1, the operation mode determination circuit of the present invention (for example the operation mode determination circuit 2 or 3) operates in the low power detach detection procedure, and is determined to be in the detach mode earlier (for example the mode operation resistor RS is set as open), and therefore the pull-up power is adjusted to the second power level (for example the USB ID pin voltage VID is adjusted to be at V3 from time point T0 to T1). From time point T1, the resistance of the mode operation resistor RS is changed due to the attaching on the USB interface (for example but not limited to setting to a normal operation mode by attaching the USB interface with a predetermined resistance of the mode operation resistor RS), and therefore the USB ID pin voltage VID falls to be less than the voltage threshold VTH3 (for example at time point T2, which corresponds to the resistance of the mode operation resistor RS being set to be less than a predetermined resistance threshold RTH3) with the pull-up power being at the second power level, whereby the operation mode detection procedure is triggered (i.e. from time point T2). And from time point T2, the pull-up power is adjusted to the first power level (for example the USB ID pin voltage VID is determined to be VRS as shown from time point T2 to T3). In this embodiment, during this time period, the voltage sensing circuit 20 determines for example the normal operation mode by sensing the USB ID pin voltage VID which is at the level VRS at this moment.

Still referring to FIG. 4, after the operation mode detection procedure lasting for the predetermined first time period TP1, the low power detach detection procedure is triggered (from time point T3), and the pull-up power is adjusted to be at the second power level. In one embodiment, in the low power detach detection procedure (starting from around time point T3), the pull-down circuit 50 executes the pull-down operation, that is, it pulls the USB ID pin voltage VID down to ground voltage as shown in the figure. In one embodiment, the pull-down operation stops after lasting for the second predetermined time period TP2 (till time point T4 as shown in the figure). And then after time point T4, the USB ID pin voltage VID is determined to rise to the level VRS' according to the pull-up power being at the second power level and the resistance of the mode operation resistor RS. In one preferred embodiment, VRS' is lower than the first voltage threshold VTH1. Note that in one embodiment, the aforementioned pull-down operation may be omitted.

Still referring to FIG. 4, in this embodiment, from time point T5, the USB ID pin voltage VID rises to exceed the first voltage threshold VTH1 due to the detach of the USB interface (for example but not limited to detaching the USB connector so that the mode operation resistor is open), which therefore triggers to enter the operation mode detection procedure again. And from time point T5 as shown in the figure, the pull-up power is adjusted to be at the first power level (for example the USB ID pin voltage VID is determined to be at level VIA from time point T5 to T6). In one embodiment, in the operation mode detection procedure, the voltage sensing circuit 20 senses the USB ID pin voltage VID and determines a detach mode when the USB ID pin voltage VID (for example VIA as shown in the figure) exceeds the second voltage threshold VTH2. And then, similarly, after the pull-up power keeps at first power level for the determined first time period TP1 (i.e. T5-T6), the pull-up power is adjusted to be at the second power level (for example the USB ID pin voltage VID is determined to be at the level V3 from the time point T6).

Note that in a preferred embodiment, the third voltage threshold VTH3 is lower than the first voltage threshold VTH1, that is, the resistance threshold RTH3 of the mode operation resistor RS is smaller than the resistance threshold RTH1), such that the operation mode detection procedure is not to be triggered too easily by error.

Figure 5:
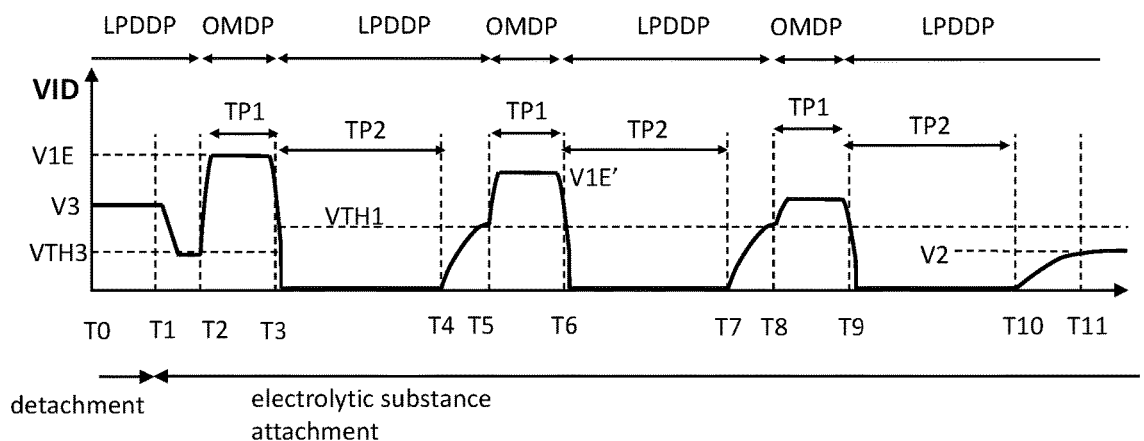
FIG. 5 shows a schematic waveform corresponding to FIGS. 2 and 3 for illustrating electrolytic substance attachment.

Referring to FIG. 5 which shows a schematic waveform corresponding to FIGS. 2 and 3 for illustrating electrolytic substance attachment. This embodiment is similar to that of FIG. 4 in the beginning from time point T0 to T1. In this embodiment, as shown in the figure, an electrolytic substance (such as water) is coupled or attached to the USB ID pin from time point T1, and therefore the USB ID pin voltage VID falls to be lower than the voltage threshold VTH3 due to the parasitic resistance of the electrolytic substance, and the operation mode detection procedure is triggered (i.e. from T2). And from time point T2, the pull-up power is adjusted to be at the first power level (for example the USB ID pin voltage VID is determined to be VIE between T2 to T3 as shown in the figure). After that, as shown in the figure, a low power detach detection procedure is executed between time points T3 and T5.

Next, in the low power detach detection procedure (starting from around time point T3), the pull-down circuit 50 executes the pull-down operation, and stops after lasting for the second predetermined time period TP2 (till time point T4 as shown in the figure). After the pull-down operation stops, the USB ID pin voltage VID may rise due to the pull-up power (still at the second power level at this moment), and if USB ID pin voltage VID exceeds VTH1 (for example at time point T5), the operation mode detection procedure will be triggered again (time points T5 to T6).

And starting from time point T5, since the USB ID pin voltage VID may still rise to be higher than the voltage threshold VTH1 again, the operation mode determination circuit according to the present invention (operation mode determination circuit 2 or 3) is triggered to enter the operation mode detection procedure for the second time (i.e. T5-T6). In the operation mode detection procedure, the pull-up power is adjusted to be at the first power level (for example the USB ID pin voltage VID is adjusted to V1E' from T5-T6 as shown in the figure, wherein V1E' may be the same or different from V1E) and lasts for the first predetermined time period TP1 (till time point T6), and then the low power detach detection procedure is triggered for the second time (i.e. T6-T8), and the pull-up power is adjusted to the second power level again.

Still referring to FIG. 5, in this embodiment, the USB ID pin voltage VID will finally reach a steady state voltage (for example V2 after time points T10) after several repeated transitions between the aforementioned operation mode detection procedure and the low power detach detection procedure, while in other embodiments, the USB ID pin voltage VID may reach the steady state voltage directly after the first pull-down operation stops without repeated transitions. In one embodiment, the steady state voltage will not be higher than the first voltage threshold VTH1.

It is worthy note that with an electrolytic substance existing and being coupled to the USB ID pin, a steady state voltage with the second power level can be reached, and since the second power level is sufficiently smaller than the first power level as mentioned earlier, the electrolysis effect of the electrolytic substance is negligible.

Note that in another embodiment, it may be so arranged that the steady state voltage is higher than the voltage threshold VTH1, but the operation mode detection procedures repeat with a longer intervals in between. Though the electrolysis effect is relatively higher in this case, but the rusting can still be slowed down due to the lower duty cycle of the operation mode detection procedure. In one embodiment, after a time-out period from when the steady state voltage is reached, the operation mode detection procedure can be triggered.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. For example, the voltage sensing circuit and the floating detection circuit can be combined into one circuit. Furthermore, those skilled in this art can readily conceive variations and modifications within the spirit of the present invention. For example, in all of the embodiments described above, the setting resistances (including water) are relative to ground level, but they can be relative to any other reference voltage. And, the present invention can be applied to applications other than the USB and pin types other than the USB ID pin. As another example, the thresholds in the above embodiments, such as the threshold for determining the operation mode, or the threshold of the floating detection circuit, are in voltage form, but these thresholds can be in other forms such as current thresholds or power thresholds. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. An operation mode determination circuit, configured to operably sense a setting resistance between a setting node and a reference voltage or a ground to determine an operation mode, comprising:

a pull-up power circuit, configured to operably generate a pull-up power onto the setting node, and adjust the pull-up power to be at a first power level in an operation mode detection procedure, wherein the pull-up power circuit triggers an low power detach detection procedure after a first predetermined time period from when the operation mode detection procedure starts, and adjusts the pull-up power to be at a second power level in the low power detach detection procedure, wherein the second power level is less than the first power level to an extent that when an electrolytic substance exists and is coupled to the setting node, an electrolysis effect of the electrolytic substance is negligible;

a voltage sensing circuit, configured to operably sense a voltage level of the setting node to determine an operation mode in the operation mode detection procedure; and a floating detection circuit which includes a comparison circuit for comparing the voltage level of the setting node to a first voltage threshold in the low power detach detection procedure, the floating detection circuit being configured to operably trigger the operation mode detection procedure when the voltage level of the setting node is higher than the first voltage threshold.

2. The operation mode determination circuit of claim 1, further including a pull-down circuit which is configured to operably execute a pull-down operation in the low power detach detection procedure to pull down the voltage level of the setting node to the reference voltage or the ground.

3. The operation mode determination circuit of claim 2, wherein the pull-down circuit pulls down the voltage level of the setting node to the reference voltage or the ground for a second predetermined time period and then stops the pull-down operation.

4. The operation mode determination circuit of claim 3, wherein the second predetermined time period is longer than the first predetermined time period to an extent that when the electrolytic substance exists and is coupled to the setting node, after a steady state time point, the voltage level of the setting node is not higher than the first voltage threshold, so that the electrolysis effect of the electrolytic substance is negligible.

5. The operation mode determination circuit of claim 1, wherein in the operation mode detection procedure, a detach mode is determined by the voltage sensing circuit when the voltage level of the setting node is higher than a second voltage threshold, wherein after the detach mode is determined and in the low power detach detection procedure, the floating detection circuit senses the voltage level of the setting node, and when the voltage level of the setting node is lower than a third voltage threshold, the floating detection circuit triggers to enter the operation mode detection procedure.

6. The operation mode determination circuit of claim 5, wherein the third voltage threshold is lower than the first voltage threshold.

7. The operation mode determination circuit of claim 1, wherein the pull-up power circuit includes a pre-regulator circuit configured to operably generate a pre-regulated voltage, and a pull-up resistor or a pull-up current source, wherein the pull-up resistor or the pull-up current source is electrically coupled between the pre-regulated voltage and the setting node, wherein in the operation mode detection procedure, the pre-regulator circuit adjusts the pre-regulated voltage to be at the first voltage level, and/or adjusts the pull-up resistor to have a first resistance, and/or adjusts the pull-up current source to be at a first current level such that the pull-up power is at the first power level, and in the low power detach detection procedure, the pre-regulator circuit adjusts the pre-regulated voltage to be at a second voltage level, and/or adjusts the pull-up resistor to have a second resistance, and/or adjusts the pull-up current source to be at a second current level such that the pull-up power is at the second power level.

8. The operation mode determination circuit of claim 1, wherein the pull-down circuit includes a pull-down resistor or a pull-down current source electrically coupled between the setting node and the reference voltage or the ground, wherein in the pull-down operation, the voltage level of the setting node is pulled down to the reference voltage or the ground correspondingly by the pull-down resistor or the pull down current source.

9. The operation mode determination circuit of claim 1, wherein the setting node is a USB (Universal Serial Bus) compliant ID pin, and the operation mode is the USB OTG (On-The-Go) mode.

10. The operation mode determination circuit of claim 1, wherein the electrolytic substance is water.

11. A method of determining an operation mode according to a setting resistance between a setting node and a reference voltage or a ground to determine an operation mode, comprising:

generating a pull-up power onto the setting node;

in an operation mode detection procedure, sensing a voltage level of the setting node to determine the operation mode; and in an low power detach detection procedure, comparing the voltage level of the setting node to a first voltage threshold, and triggering the operation mode detection procedure when the voltage level of the setting node is higher than the first voltage threshold;

wherein the step of generating the pull-up power includes:

in the operation mode detection procedure, adjusting the pull-up power to be at a first power level, and after a first predetermined time period from when the operation mode detection procedure starts, triggering the low power detach detection procedure; and in the low power detach detection procedure, adjusting the pull-up power to be at a second power level, wherein the second power level is less than the first power level to an extent that when an electrolytic substance exists and is coupled to the setting node, an electrolysis effect of the electrolytic substance is negligible.

12. The method of claim 11, further including: executing a pull-down operation in the low power detach detection procedure to pull down the voltage level of the setting node to the reference voltage or the ground.

13. The method of claim 12, further including: stopping the pull-down operation after pulling down the voltage level of the setting node to the reference voltage or the ground for a second predetermined time period.

14. The method of claim 13, wherein the second predetermined time period is longer than the first predetermined time period to an extent that when the electrolytic substance exists and is coupled to the setting node, after a steady state time point, the voltage level of the setting node is not higher than the first voltage threshold, so that the electrolysis effect of the electrolytic substance is negligible.

15. The method of claim 11, wherein in the operation mode detection procedure, determining a detach mode when the voltage level of the setting node is higher than a second voltage threshold, wherein after the detach mode is determined and in the low power detach detection procedure, when the voltage level of the setting node is lower than a third voltage threshold, entering the operation mode detection procedure.

16. The method of claim 15, wherein the third voltage threshold is lower than the first voltage threshold.

17. The method of claim 11, wherein the setting node is a USB (Universal Serial Bus) compliant ID pin, and the operation mode is the USB OTG (On-The-Go) mode.

18. The method of claim 11, wherein the electrolytic substance is water.

* * * * *